United States Patent
Ito et al.

(10) Patent No.: US 8,258,016 B2
(45) Date of Patent: Sep. 4, 2012

(54) SEMICONDUCTOR PACKAGE HAVING INCREASED RESISTANCE TO ELECTROSTATIC DISCHARGE

(75) Inventors: Choshu Ito, San Mateo, CA (US); William M. Loh, Fremont, CA (US); Rajagopalan Parthasarathy, Milpitas, CA (US)

(73) Assignee: LSI Corporation, Milpitas, CA (US)

( * ) Notice: Subject to any disclaimer, the term of this patent is extended or adjusted under 35 U.S.C. 154(b) by 645 days.

(21) Appl. No.: 12/337,519

(22) Filed: Dec. 17, 2008

(65) Prior Publication Data
US 2009/0104735 A1    Apr. 23, 2009

Related U.S. Application Data

(62) Division of application No. 11/304,862, filed on Dec. 14, 2005, now Pat. No. 7,498,664.

(51) Int. Cl.
*H01L 21/44* (2006.01)
(52) U.S. Cl. ...... 438/118; 438/25; 438/55; 257/E21.499
(58) Field of Classification Search .......... 438/121–123, 438/118–119, 25, 55; 257/E21.499
See application file for complete search history.

(56) References Cited

U.S. PATENT DOCUMENTS

| 5,175,613 A | 12/1992 | Barker et al. |
| 5,371,404 A | 12/1994 | Juskey et al. |
| 5,767,447 A * | 6/1998 | Dudderar et al. ............. 174/546 |
| 7,030,482 B2 | 4/2006 | Haines |
| 7,135,769 B2 | 11/2006 | Ni et al. |
| 2005/0275070 A1 | 12/2005 | Hollingsworth |
| 2007/0262427 A1 | 11/2007 | Koide |

OTHER PUBLICATIONS

Office Action dated Oct. 3, 2007 in U.S. Appl. No. 11/304,862.
Office Action dated Jun. 4, 2008 in U.S. Appl. No. 11/304,862.
Notice of Allowance dated Oct. 22, 2008 in U.S. Appl. No. 11/304,862.

* cited by examiner

*Primary Examiner* — Thanhha Pham
(74) *Attorney, Agent, or Firm* — Beyer Law Group LLP

(57) ABSTRACT

Embodiments of the invention include a semiconductor integrated circuit package that includes a substrate having an integrated circuit die attached thereto. The package includes a ESD shield attached to the substrate. The ESD shield configured to increase the ESD hardness of the package. The ESD shield can further serve to stiffen the package to prevent warping and operate as a heat spreader.

23 Claims, 2 Drawing Sheets

SEMICONDUCTOR PACKAGE HAVING INCREASED RESISTANCE TO ELECTROSTATIC DISCHARGE

CROSS-REFERENCE TO RELATED APPLICATION

This application is a divisional application claiming priority to U.S. patent application Ser. No. 11/304,862, entitled "Semiconductor Package Having Increased Resistance to Electrostatic Discharge," which is incorporated herein in its entirety.

TECHNICAL FIELD

The invention described herein relates generally to semiconductor device packaging. In particular, the invention relates to a method and package for a semiconductor device that is resistant to electrostatic discharge that can be caused by various factors.

BACKGROUND

The semiconductor industry makes wide use of standard BGA (ball grid array) type semiconductor packages. Such packages generally include a BT (bismaleimide triazine) core having various metallization and solder mask layers to form the substrate. A semiconductor die is attached to the substrate and electrically connected to various electrical connections of the substrate using ball attach or wire-bonding techniques. The wire bonds and the die are typically encapsulated with a protective layer of encapsulant. Such packages and the methods of their construction are well known to persons having ordinary skill in the semiconductor packaging arts. Additionally, ball attach arrangements are provided with an underfill encapsulant to protect the bonding arrangements of the solder balls.

Commonly, the packages are then provided with a stiffener and a heat spreader to complete the packages. These completed packages are then subject to a series of tests used to qualify the packages to insure they meet all the necessary specifications prior to shipping.

One such test subjects the package to a series of electrostatic discharge (ESD) events to determine the packages robustness and resistance to these ESD events. In the present art, each of the ball pins of a ball grid array type package are tested for charge coupled electrostatic discharge failures. To alleviate this problem each die includes shunt circuitry associated with each external connection. One purpose of this shunt circuitry is to provide a level of resistance to ESD events.

Commonly, testing is done using a device specifically constructed for administering such testing. One example of such a tester is an Orion CDM Tester produced by Oryx Instruments Corporation of Fremont Calif. Such equipment can be programmed to implement testing for compliance in accordance with a number of test standards. Typical examples being provided by the JEDEC, AEC, and ESDA standards as well as others. One particular standard being JEDEC No. JESD22-C101C.

FIG. 1 is a simplified schematic cross-section view of a portion of a standard PBGA (plastic ball grid array) package 101 arranged on a tester. Commonly, such packages 101 include a substrate 102 or core. The core is typically sandwiched between two metallization layers which also include layers of solder mask. Most commonly, the core 102 is formed of fiber material suspended in a cured a BT resin material. This core 102 is then treated to form metallization layers. Commonly, copper materials or coated copper materials are used. Other conductive materials are also used. A solder mask layer is then formed over the metallization layers. Typically, the solder mask layer is photolithographically patterned to create a solder mask that can be used to define a corresponding pattern in the metallization layers. Such substrates are commonly very thin, for example, less than about 0.60 mm thick. The methods of accomplishing this are very well known to those having ordinary skill in the art With continued reference to FIG. 1, the substrate 102 forms part of a semiconductor package 101. Ball attach pads are typically formed on a backside 105 surface of the substrate 102. Solder balls 115 are typically formed on the ball attach pads. Additionally, a semiconductor integrated circuit die 110 is mounted to the front side 106 surface of the substrate 102. In many implementations, solder balls electrically connect the die 110 to associated electrical contact points on the substrate 101. Vias (not shown in this simplified view) formed in and through the substrate 102 enable the electrical communication between circuitry of the die 110 and the solder balls 115 mounted on the backside 105 of the package 101. The die and electrical connections at the interface between the die 110 and substrate 102 are commonly encapsulated in a protective layer 112 of encapsulating underfill material.

Additionally, many prior art devices include a metal stiffener 103 and a heat spreaders 104. Such elements are known to persons having ordinary skill in the art.

With continued reference to FIG. 1, the package 101 is typically placed upside down (solder ball side up) on a tester 120. As shown here, the package is placed on an insulated tester board for testing. For example, the package 101 is placed on a tester chuck which has a layer of insulating material 122 (e.g., FR-4 or other such materials). The tester board (121, 122) is set at some predetermined electrical potential (e.g., 500 volts). Then a testing probe 123 descends to contact each of solder balls of the package 101. The probe is commonly set at ground. If the package survives pre-selected test routine without damage the packaged is "qualified".

This commonly constructed package has provided satisfactory ESD protection until recently. Now, with increasing scaling of circuit elements formed on the die, smaller less ESD resistant devices and elements are becoming more common. These devices have increased vulnerability to ESD events. Thus, the traditional package format is increasingly lacking in the ability to protect these vulnerable elements from ESD events. Accordingly, the incidence of ESD induced package failure has been rising and is expected to continue to do so as circuitry and device sizes continue to shrink.

Accordingly, what is needed is a packaging design and approach that provides increased resistance to ESD induced package failure.

SUMMARY OF THE INVENTION

In accordance with the principles of the present invention, an improved semiconductor package and methods for its fabrication are disclosed.

In general, the present invention is directed toward methods and packages that increase the package impedance of a semiconductor package thereby increasing the resistance of the overall package to ESD associated package failures.

One embodiment of the invention comprises a semiconductor integrated circuit package having a substrate with a die attached to the front side thereof. The package includes a die electrically connected with the substrate. The package further including a discharge shield configured to protect the die from electrostatic discharge events. In still another related embodiment, the ESD shield can comprise a frame and cap elements.

In a method embodiment, aspects of the invention involve a method for forming an ESD hardened semiconductor integrated circuit package. The method including providing a substrate having a semiconductor integrated circuit die mounted thereon. An electrostatic discharge shield is mounted on the substrate over the die. A thermal grease is placed between the top and die to facilitate heat flow from the die to the ESD shield.

Other aspects and advantages of the invention will become apparent from the following detailed description and accompanying drawings which illustrate, by way of example, the principles of the invention.

BRIEF DESCRIPTION OF THE DRAWINGS

The following detailed description will be more readily understood in conjunction with the accompanying drawings, in which.

It is to be understood that in the drawings like reference numerals designate like structural elements. Also, it is understood that the depictions in the Figures are not necessarily to scale.

DETAILED DESCRIPTION OF THE INVENTION

The present invention has been particularly shown and described with respect to certain embodiments and specific features thereof. The embodiments set forth hereinbelow are to be taken as illustrative rather than limiting. It should be readily apparent to those of ordinary skill in the art that various changes and modifications in form and detail may be made without departing from the spirit and scope of the invention.

In general, the present invention encompasses semiconductor package designs that include an ESD shield formed over the die in order to reduce the incidence of ESD induced devices failures. In the following detailed description, semiconductor package embodiments will be disclosed. In particular, the depicted structures show package embodiments having various ESD shield embodiments suitable for increasing package resistance to ESD induced package and device failures.

Figure 2A:
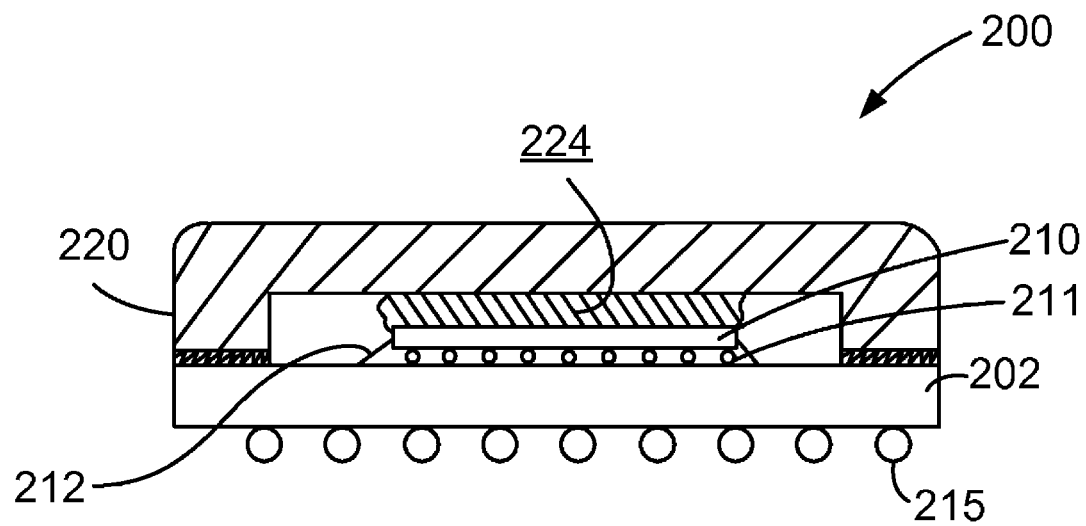
FIGS. 2(a)-2(b) are simplified cross-sectional views of embodiments of the invention depicting various ESD shield embodiments formed in accordance with the principles of the invention.

FIG. 2(a) depicts one embodiment of a semiconductor package constructed in accordance with the principles of the invention. The depicted embodiment is view in plan view. In some ways the depicted embodiment is similar to a prior art package. However, there are several significant distinctions. The package 200 includes a substrate 202. The substrate 202 in the depicted embodiment can be an ordinary BT substrate such a described herein above. The substrate 202 can be an ordinary two-layer PBGA substrate. Commonly, such substrates are on the order of 0.60 mm thick although substrates of any thickness can be employed. A die 210 is mounted to the substrate 202. Such mounting is done using any of a number of different standard techniques.

In the depicted embodiment, the die 210 is electrically connected to the substrate using a set solder balls 211 that contact via structures (not shown) to electrically connect the die 210 with the backside solder balls 215 of the package. Generally, a layer of encapsulant underfill 212 material is injected between the balls 211 between the die 210 and substrate 202. Such underfill material is of a type generally known in the art.

In order to pass the specification, a package must be able to withstand a certain level of electrostatic discharge to be properly "qualified". Using, for example, a JEDEC standard Charged Device Model (CDM) Electrostatic Discharge specification a device constructed in accordance with the principles of the invention would be able to function properly after being subjected to a current of about 5 A for about 1 nanosecond (ns). Of course other standards exist (such as the previously referenced AEC and ESDA standards) and the inventors contemplate that a package constructed in accordance with the principles of the invention will be sufficiently robust to protect such packages from ESD related failures.

Again referring to FIG. 2A, the embodiment includes an electrostatic discharge shield 220 mounted on the substrate 202. The shield 220 is configured to protect the die 210 from electrostatic discharge events. The electrostatic discharge shield 220 can be simply configured. In the depicted embodiment, the electrostatic discharge shield 220 is simply placed on the substrate 210 in place of the prior art stiffener 103 and heat spreader 104. It can be affixed using a standard adhesive if desired. One example is a thermal setting epoxy. For example, MC-723 manufactured by Ablestik can be employed. Of course many other adhesive known to those having ordinary skill in the art can also be employed. Additionally, other means of affixing the shield can be employed. Mounting pegs, solder and numerous other approaches can be employed.

In one particularly useful embodiment, the shield 220 is used to replace the stiffener and the heat spreader. In such an embodiment, a thermal grease 224 is spread between the die and shield to enhance the thermal transfer between the die 210 and the shield 220 which serves as the heatspreader.

The inventors have discovered that AlSiC (aluminum silicon carbide) works well as an ESD shield 220. This is because AlSiC has a sufficiently high resistivity enabling the shield to maximize impedance between the die and an external ESD generating source, thereby minimizing ESD current into the die. This also results in reduced capacitance between the die and the external ESD generating source. For example, AlSiC has a resistivity in the range of about 30-50 $\mu\Omega\cdot$cm ($10^{-6}$ ohm centimeters). AlSiC also provides a sufficiently high thermal conductivity to enable its effective use as a heat spreader. For example, AlSiC has a thermal conductivity in the range of about 130-200 W/mK. What makes AlSiC a surprising choice is the CTE (coefficient of thermal expansion) mismatch between AlSiC and ordinary substrate materials like BT. BT has a CTE of about 17 ppm/° C. whereas the CTE for AlSiC is in the range of about 6-9 ppm/° C. The inventors have found that under most operational conditions such a mismatch can still be functional in a package. The inventors also believe that shields comprising BeO and $Al_2O_3$ can also be employed to some good effect. The inventors further contemplate that materials having a resistivity greater than about 30 $\mu\Omega\cdot$cm and high thermal conductivity high enough to facilitate its use as a heat spreader can also be employed.

It should be noted that although the invention is described here with respect to a two-layer BGA package, the principles and methodologies described here can readily be used to construct four and six (or more) layer packages, as well as, EPBGA (enhanced plastic ball grid array) packages, leaded packages (those with leads rather than solder balls), or chip scale packages (those that are 15×15 mm² or smaller). The support elements can be formed on the front side and/or the backside of the substrate, depending on the amount of stiffening desired.

Figure 1:
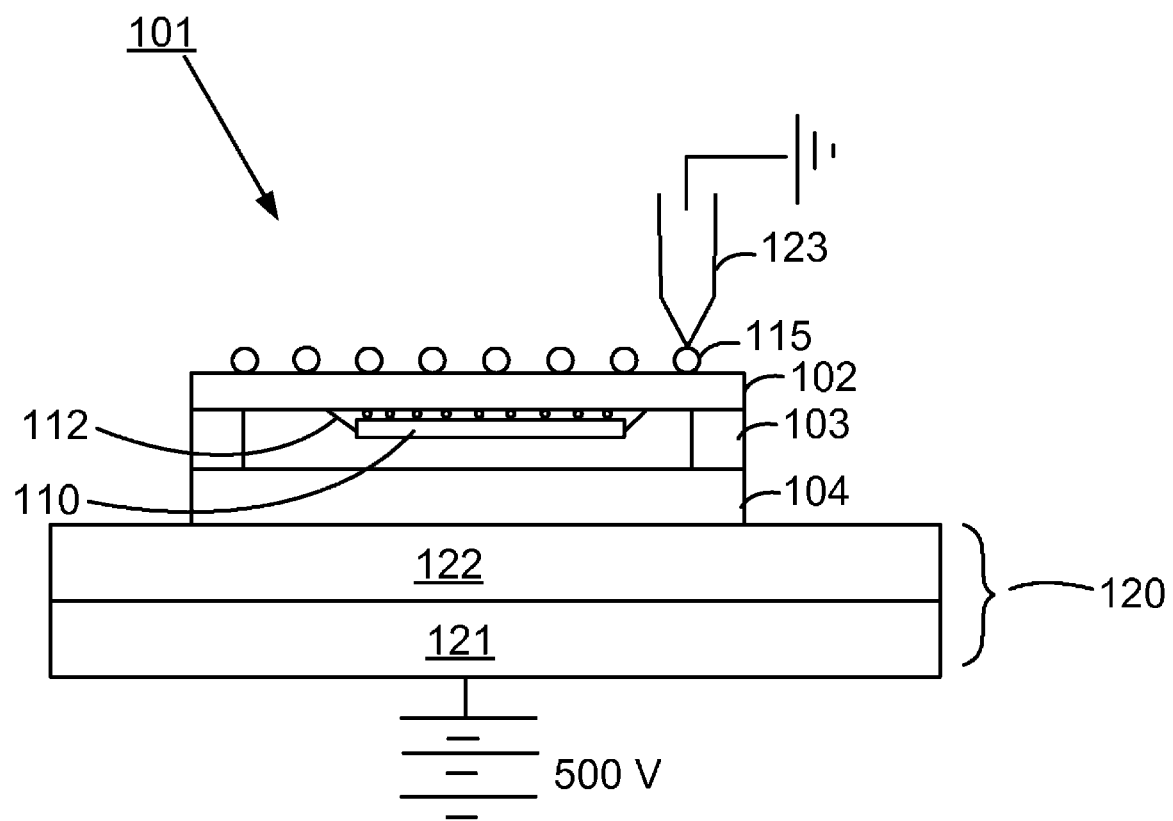
FIG. 1 is a simplified schematic views of a conventional substrate and package used to package semiconductor IC chips.
Figure 2B:
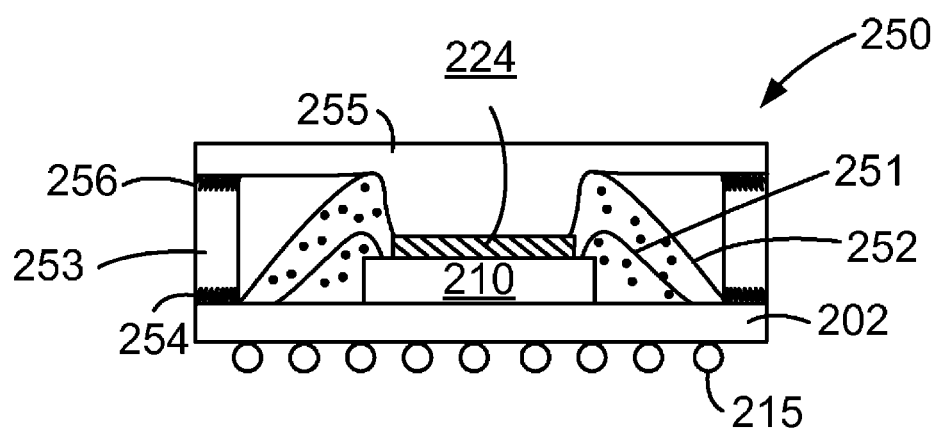

Another embodiment is depicted in simplified schematic sectional view in FIG. 2(b). Again, in many ways the depicted embodiment is similar to that shown, for example, in FIG. 1. The package 250 again includes a substrate 202. Typically, the substrate 202 is an ordinary BT substrate such a described herein above. Again, the substrate 202 can be an ordinary two-layer PBGA substrate or alternatively a four and six (or more) layer package. Also the package can comprise EPBGA (enhanced plastic ball grid array) packages, leaded packages (those with leads rather than solder balls), or chip scale packages. The electrical connections include wire bonds 251 that connect the die 210 to the bottom solder balls 215. A layer 252 of protective encapsulant material is used to protect and encapsulate the wires 251. In this embodiment, the ESD shield comprises an ESD shield frame 253 that is mounted on the substrate 202. The ESD frame 253 is formed of material having good electrical insulation properties. For example, AlSiC can be used as well as other electrically insulative materials. Such mounting can be conducted using a variety of mounting techniques known to those having ordinary skill in the art. In the depicted embodiment an adhesive layer 254 is used to adhere the frame 253 to the substrate 202. For example, a thermal setting adhesive can be used. An ESD shield cap 255 is then attached to the top of the frame 253. The ESD cap 255 is formed of material having good electrical insulation properties. Also, in some embodiments it is desirable that the cap 255 have a relatively high thermal conductivity enabling it to function as a heatspreader. Moreover, in embodiments where the frame 253 also demonstrates a high thermal conductivity the frame expands the capacity of the shield as a heat spreader. Therefore, AlSiC also provides an excellent cap 255 material. The cap 255 can be mounted to the frame 253 conducted using a variety of mounting techniques known to those having ordinary skill in the art. In the depicted embodiment an adhesive layer 256 is used to adhere the cap 255 to the frame 253. Also, a thermal grease 224 can be positioned between the die and the shield to enhance the heat transfer capacity of the package 250.

In the depicted embodiments, the shield 220 is separated from the top of the die by about 75 microns and is about 1.2 mm tall. In one embodiment of the invention the package is configured to dissipate an ESD of at least 20 Watts (W).

Some of the advantages of package embodiments described herein include manufacturability advantages related to the fact that these embodiments require no change in existing die design. Additionally, the inventors contemplate that the shunts currently employed for ESD purposes are no longer as important and in some cases may not be necessary at all. To that end, the removal of the shunts from the die, frees up more space on the die for operational circuitry thereby expanding the functionality of the die. Additionally, the introduction of the heat shield does not substantially affect package manufacturing process flow with the shield replacing existing stiffeners and heat spreaders.

The present invention has been particularly shown and described with respect to certain preferred embodiments and specific features thereof. However, it should be noted that the above-described embodiments are intended to describe the principles of the invention, not limit its scope. Therefore, as is readily apparent to those of ordinary skill in the art, various changes and modifications in form and detail may be made without departing from the spirit and scope of the invention as set forth in the appended claims. Other embodiments and variations to the depicted embodiments will be apparent to those skilled in the art and may be made without departing from the spirit and scope of the invention as defined in the following claims. In particular, it is contemplated by the inventors that support elements constructed for the purpose of increasing the rigidity of a semiconductor package can be formed on the package in any configuration. Although only two configurations are expressly disclosed herein, it should be appreciated by anyone having ordinary skill in the art that, using the teachings disclosed herein, many different package support configurations can be implemented and still fall within the scope of the claims. Further, reference in the claims to an element in the singular is not intended to mean "one and only one" unless explicitly stated, but rather, "one or more". Furthermore, the embodiments illustratively disclosed herein can be practiced without any element which is not specifically disclosed herein.

We claim:

1. A method for forming an ESD hardened semiconductor integrated circuit package having resistance to electrostatic discharge failure, the method comprising
providing a substrate having a semiconductor integrated circuit die mounted thereon;
placing thermal grease on a top surface of the semiconductor integrated circuit die; and
mounting an electrostatic discharge shield on the substrate so that the electrostatic discharge shield is in thermal contact with the thermal grease wherein the electrostatic discharge shield comprises a material having an electrical resistivity of greater than about 30 $\mu\Omega\cdot$cm and a thermal conductivity of greater than about 150.

2. The method of claim 1 wherein mounting electrostatic discharge shield on the substrate comprises:
affixing an electrostatic discharge resistant frame on the substrate; and
affixing a electrostatic discharge resistant cap on top of the electrostatic discharge resistant frame to cover the die.

3. The method of claim 2 wherein the electrostatic discharge resistant frame is affixed to the substrate using adhesive and the electrostatic discharge resistant cap is affixed to the top of the electrostatic discharge resistant frame using adhesive.

4. The method of claim 2 wherein the thermal grease in the ESD hardened semiconductor integrated circuit package is interposed between the semiconductor integrated circuit die and the electrostatic discharge resistant cap.

5. The method of claim 2 wherein the electrostatic discharge resistant frame comprises a layer at least about 25 microns ($\mu$m) thick.

6. The method of claim 1 wherein the electrostatic discharge resistant shield is able to withstand an electrostatic potential of at least 500 volts between the semiconductor integrated circuit die and an electrostatic charge external to the ESD hardened semiconductor integrated circuit package.

7. The method of claim 1 wherein the electrostatic discharge shield is configured to reduce capacitance between the semiconductor integrated circuit die and an electrostatic charge external to the ESD hardened semiconductor integrated circuit package.

8. The method of claim 1 wherein the electrostatic discharge shield is configured to stiffen the ESD hardened semiconductor integrated circuit package to prevent warping of the package.

9. The method of claim 1 wherein the electrostatic discharge shield is configured to dissipate greater than about 20 Watts.

10. The method of claim 1 wherein the electrostatic discharge shield is formed of an AlSiC material.

11. The method of claim 10 wherein the semiconductor integrated circuit die is electrically and physically connected with electrical connectors on the front side of the substrate using a plurality of wire bonds.

12. The method of claim 10 wherein a plurality of solder balls is used to electrically connect the semiconductor integrated circuit die with electrical connectors on the front side of the substrate.

13. The method of claim 12 wherein underfill material is used to encapsulate the solder balls and portions of the ESD hardened semiconductor integrated circuit package between the semiconductor integrated circuit die and the substrate.

14. The method of claim 13 wherein a side of the semiconductor integrated circuit die opposite to the solder balls is covered with the thermal grease to enhance a heat conduction between the semiconductor integrated circuit die and the electrostatic discharge shield enabling the electrostatic discharge shield to operate more efficiently as a heat spreader for the ESD hardened semiconductor integrated circuit package.

15. The method of claim 1 wherein the ESD hardened integrated circuit package comprises a ball grid array package.

16. The method of claim 1 wherein the ESD hardened integrated circuit package comprises a leaded package.

17. The method of claim 1 wherein the ESD hardened integrated circuit package comprises a chip-scale package.

18. The method of claim 1 wherein the electrostatic discharge shield material has a CTE of between 6-9 ppm/C and is formed from a metal-ceramic composite material.

19. The method of claim 1 wherein:
the semiconductor integrated circuit die includes a bottom surface that is opposite the top surface, the bottom surface being in contact with the substrate; and
the method further comprises providing a protective encapsulant material that encapsulates the bonding wires wherein the bottom surface of the semiconductor integrated circuit die is in contact with the substrate such that the protective encapsulant material is prevented from coming between the semiconductor integrated circuit die and the substrate.

20. A method for forming an ESD hardened semiconductor integrated circuit package having resistance to electrostatic discharge failure, the method comprising
providing a substrate having a semiconductor integrated circuit die mounted thereon, the semiconductor integrated circuit die having a top surface and an opposing bottom surface that is in contact with the substrate, the top surface being electrically connected to the substrate using bonding wires;
placing thermal grease on the top surface of the semiconductor integrated circuit die; and
mounting an electrostatic discharge shield on the substrate so that the electrostatic discharge shield is in thermal contact with the thermal grease, the electrostatic discharge shield comprising a material that has an electrical resistivity of greater than about 30 $\mu\Omega\cdot$cm and a thermal conductivity of greater than about 150 W/mK.

21. The method of claim 20 further comprising providing a protective encapsulant material that encapsulates the bonding wires wherein the bottom surface of the semiconductor integrated circuit die is in direct contact with the substrate such that the protective encapsulant material is prevented from coming between the semiconductor integrated circuit die and the substrate.

22. A method for forming an ESD hardened semiconductor integrated circuit package having resistance to electrostatic discharge failure, the method comprising
providing a substrate having a semiconductor integrated circuit die mounted thereon;
placing thermal grease on a top surface of the semiconductor integrated circuit die; and
mounting an electrostatic discharge shield on the substrate, the electrostatic discharge shield having a distended portion that forms a pedestal with a distal end, the distal end of the pedestal being in physical and thermal contact with the thermal grease at the top surface of the semiconductor integrated circuit die, the electrostatic discharge shield comprising a material that has an electrical resistivity of greater than about 30 $\mu\Omega\cdot$cm and a thermal conductivity of greater than about 150 W/mK.

23. The method of claim 22 wherein:
the semiconductor integrated circuit die includes a bottom surface that is opposite the top surface, the bottom surface being in direct contact with the substrate; and
the method further comprises providing a protective encapsulant material that encapsulates the bonding wires wherein the bottom surface of the semiconductor integrated circuit die is in contact with the substrate such that the protective encapsulant material is prevented from coming between the semiconductor integrated circuit die and the substrate.

* * * * *